(12) United States Patent
Kanaki et al.

(10) Patent No.: US 12,142,495 B2
(45) Date of Patent: Nov. 12, 2024

(54) ETCHING METHOD AND ETCHING APPARATUS

(71) Applicant: Tokyo Electron Limited, Tokyo (JP)

(72) Inventors: Toshiki Kanaki, Albany, NY (US); Nobuhiro Takahashi, Nirasaki (JP); Megumi Umemoto, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 166 days.

(21) Appl. No.: 17/670,844

(22) Filed: Feb. 14, 2022

(65) Prior Publication Data
US 2022/0262655 A1    Aug. 18, 2022

(30) Foreign Application Priority Data

Feb. 16, 2021  (JP) ................. 2021-022826

(51) Int. Cl.
| | |
|---|---|
| *H01L 21/67* | (2006.01) |
| *H01L 21/04* | (2006.01) |
| *H01L 21/3065* | (2006.01) |
| *H01L 21/308* | (2006.01) |
| *H01L 21/311* | (2006.01) |

(52) U.S. Cl.
CPC .... *H01L 21/67069* (2013.01); *H01L 21/0475* (2013.01); *H01L 21/3065* (2013.01); *H01L 21/3085* (2013.01); *H01L 21/3086* (2013.01); *H01L 21/31116* (2013.01); *H01L 21/31144* (2013.01)

(58) Field of Classification Search
None
See application file for complete search history.

(56) References Cited

U.S. PATENT DOCUMENTS

| | | | | |
|---|---|---|---|---|
| 2014/0051256 A1* | 2/2014 | Zhong | ........... | H01L 29/66795 438/723 |
| 2019/0378724 A1* | 12/2019 | Toda | ........... | H01L 21/31116 |

FOREIGN PATENT DOCUMENTS

JP    2016063141 A    4/2016

* cited by examiner

*Primary Examiner* — Roberts P Culbert
(74) *Attorney, Agent, or Firm* — Nath, Goldberg & Meyer; Jerald L. Meyer; Tanya E. Harkins

(57) ABSTRACT

An etching method includes: forming a protective film by supplying a protective film forming gas including at least one of a compound including a hydroxyl group and water to a substrate including a surface on which a first film and a second film are formed, each of which has a property of being etched by an etching gas, wherein the protective film covers the first film such that the first film is selectively protected from among the first film and the second film when the etching gas is supplied; and selectively etching the second film by supplying the etching gas to the substrate in a state in which the protective film is formed.

12 Claims, 13 Drawing Sheets

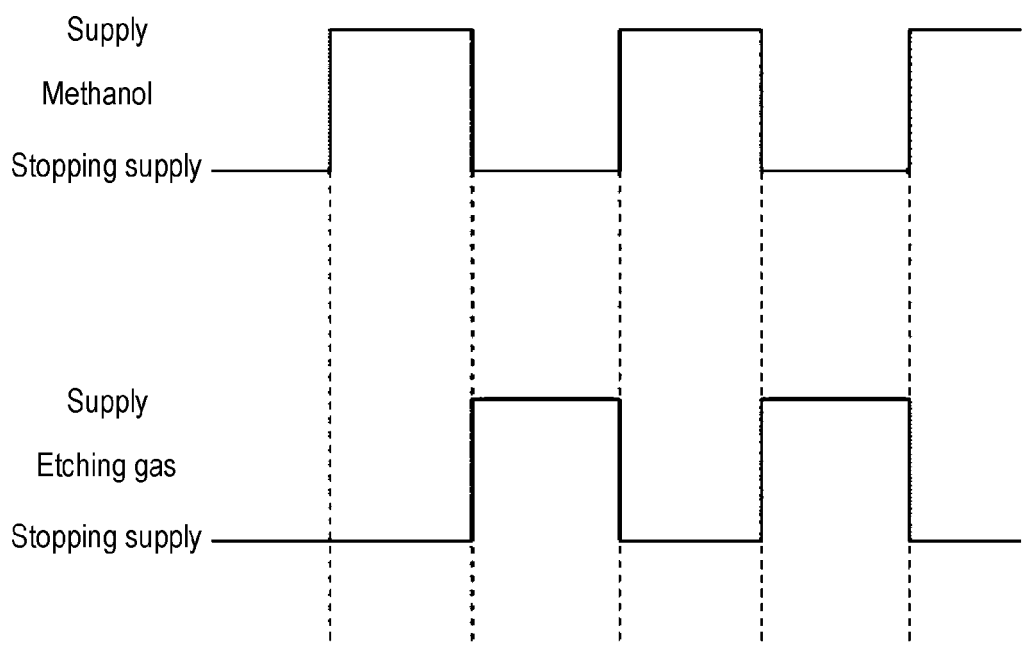

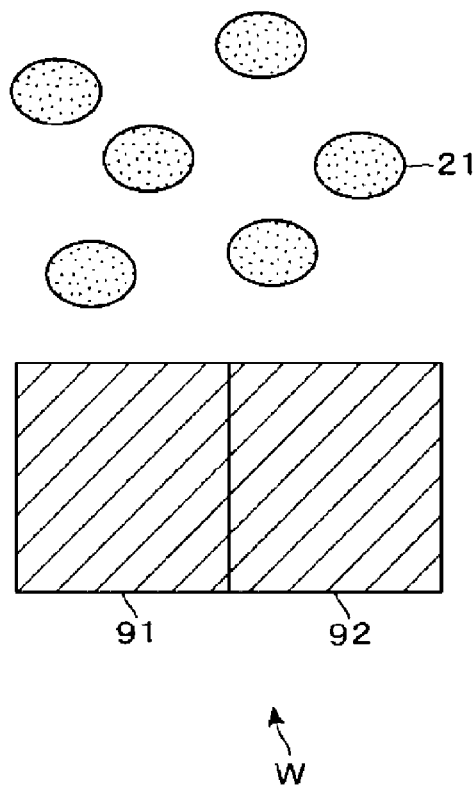

ETCHING METHOD AND ETCHING APPARATUS

CROSS-REFERENCE TO RELATED APPLICATION

This application is based upon and claims the benefit of priority from Japanese Patent Application No. 2021-022826, filed on Feb. 16, 2021, the entire contents of which are incorporated herein by reference.

TECHNICAL FIELD

The present disclosure relates to an etching method and an etching apparatus.

BACKGROUND

In constructing a semiconductor device, etching is performed on various films formed on a semiconductor wafer (hereinafter, referred to as a "wafer") which is a substrate. For example, Patent Document 1 describes that a wafer on which an interlayer insulating film called a low-k film is formed is etched to form a recess for embedding a wiring line in the interlayer insulating film.

PRIOR ART DOCUMENT

Patent Document

Patent Document 1: Japanese Laid-Open Patent Publication No. 2016-63141

SUMMARY

According to one embodiment of the present disclosure, there is provided an etching method including: forming a protective film by supplying a protective film forming gas including at least one of a compound including a hydroxyl group and water to a substrate including a surface on which a first film and a second film are formed, each of which has a property of being etched by an etching gas, wherein the protective film covers the first film such that the first film is selectively protected from among the first film and the second film when the etching gas is supplied; and selectively etching the second film by supplying the etching gas to the substrate in a state in which the protective film is formed.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 7A is a chart illustrating an example of gas supply timing during etching.
FIG. 10A is a process diagram illustrating the etching.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
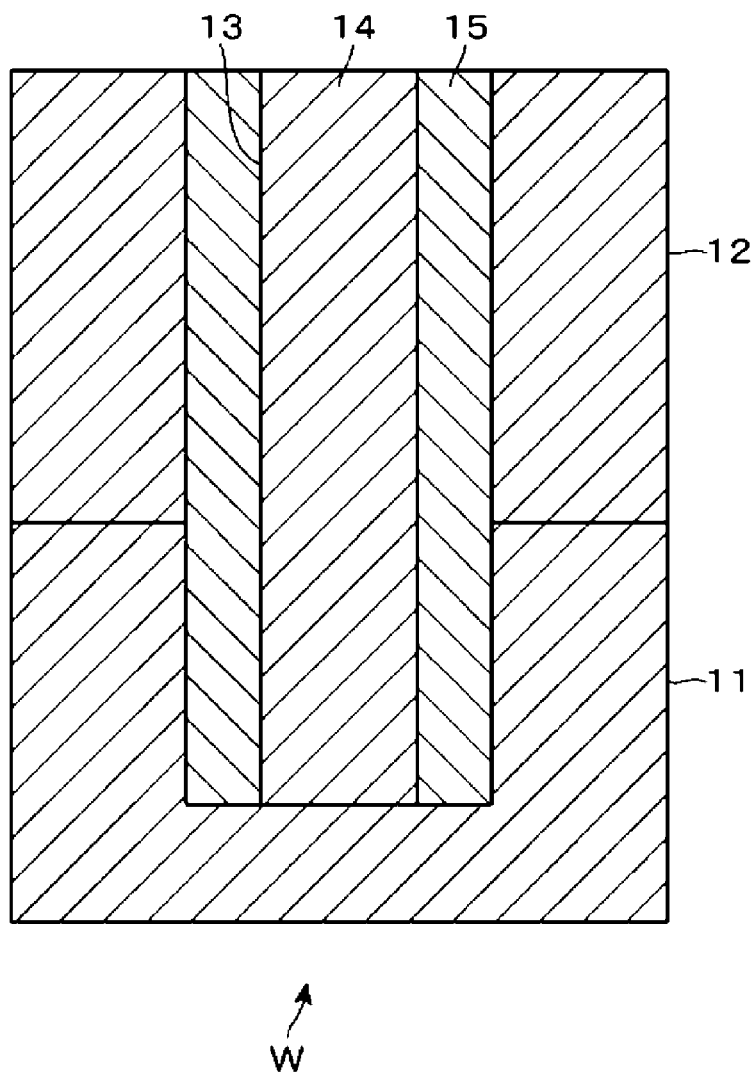
FIG. 1 is a vertical cross-sectional side view of a surface of a wafer on which etching according to an embodiment of the present disclosure is performed.

A process according to an embodiment of an etching method of the present disclosure will be described below. FIG. 1 shows a vertical cross-sectional side view of a surface portion of a wafer W on which the process is performed. In the figure, reference numeral 11 indicates a silicon germanium (SiGe) film, and a silicon oxide ($SiO_x$) film 12 is laminated on the SiGe film 11. A recess 13 is formed in the laminate of the silicon oxide film 12 and the SiGe film 11, and a polysilicon film 14 is embedded in the recess 13. In addition, between the side wall of the polysilicon film 14 and the side wall of the recess 13, a SiOCN film 15 (i.e., a film including silicon, oxygen, nitrogen, and carbon), which surrounds the lateral side of the polysilicon film 14 and is in contact with each of the side wall of the polysilicon film 14 and the side wall of the recess 13, is provided. Therefore, the laminate composed of the silicon oxide film 12 and the SiGe film 11, the SiOCN film 15, and the polysilicon film 14 are formed to be adjacent to each other in this order when viewed in the lateral direction. The polysilicon film 14 is a film to be etched, and the SiGe film 11 is a film to be non-etched.

The SiOCN film 15 is an interlayer insulating film called a low-k film, and is a porous film. The outline of this embodiment will be described. The purpose of this embodiment is to selectively etch the polysilicon film 14 from among the polysilicon film 14 and the SiGe film 11. Therefore, the supply of a protective film forming gas composed of alcohol or water (water vapor) and the supply of an etching gas (e.g., chlorine trifluoride ($ClF_3$) gas) are alternately and repeatedly performed.

The reason why the protective film forming gas is supplied is that both the polysilicon film 14 and the SiGe film 11 have a property of being etched by the etching gas. In one embodiment, the polysilicon film 14 is etched without supplying a protective film forming gas. In the process of etching the polysilicon film 14, the etching gas passes through the pores of the SiOCN film 15 and is supplied to the side wall of the SiGe film 11, and the side wall is etched. The protective film forming gas is supplied to prevent the etching gas from passing through the pores of the SiOCN film 15 and to prevent such etching of the SiGe film 11.

The protective film forming gas will be described in detail. As shown in the evaluation experiment to be described later, the protective film forming gas exhibits relatively high adsorptivity to the SiOCN film 15. Therefore, the protective film forming gas is adsorbed on the surface of the SiOCN film 15 in a relatively large amount. That is, a relatively large amount is adsorbed on the pore walls forming the pores of the SiOCN film 15, and thus the pores are sealed. This sealing prevents the etching gas from passing through the pores and being supplied to the SiGe film 11. Since the adsorptivity of the protective film forming gas to the polysilicon film 14 is low, the protective film is formed on the polysilicon film 14 with a relatively small film thickness. Even if such a protective film having a small film thickness is formed, the film disappears during etching so that the polysilicon film 14 can be etched.

Since the silicon oxide film 12 provided on the underlying SiGe film 11 is a mask for preventing etching of the SiGe film 11 and is a silicon-containing compound, the silicon oxide film 12 has a property of being etched by an etching gas like the polysilicon film 14. Since the protective film forming gas also has a high adsorptivity to the silicon oxide film 12, a protective film is also formed on the silicon oxide film 12. That is, since the silicon oxide film 12 is also protected during etching, not only the etching of the SiGe film 11 from the lateral side is prevented as described above, but also the etching from the top side is prevented with high certainty. In the case of the polysilicon film 14 and the silicon oxide film 12 described above, etching is performed in the state in which the protective film on the silicon oxide film 12 remains even after the protective film on the polysilicon film 14 disappears during etching. That is, the polysilicon film 14 is selectively etched from among the silicon oxide film 12 and the polysilicon film 14 by using the difference in the thickness of the formed protective film.

As described above, it is considered that the difference in the formed state of hydrogen bonds is involved in the cause of the difference in the adsorptivity of the protective film forming gas between the films. Specifically, the surface of each film is hydrogen-terminated. That is, in the case of the polysilicon film 14, the silicon atoms on the outermost surface of the film are in a state of being bonded to hydrogen atoms. No hydrogen bond is formed between the hydrogen-terminated silicon atoms and hydrogen atoms constituting a hydroxyl group or water. Meanwhile, the silicon oxide film 12 and the SiOCN film 15 are also hydrogen-terminated, and the oxygen atoms and the nitrogen atoms on the outermost surface of the film are bonded to the hydrogen atoms. However, hydrogen bonds can be formed between the oxygen atoms or nitrogen atoms in this state and hydrogen atoms constituting a hydroxyl group or water. Such a difference is considered to be the above-mentioned difference in adsorptivity. In addition, the protective film formed on each film of the wafer W as described above may be a liquid or a solid.

Subsequently, with reference to FIGS. 2A to 5B, processes performed on a wafer W will be described step by step. FIGS. 2A to 5B are schematic views illustrating how the surface portion of the wafer W described with reference to FIG. 1 changes depending on the processes, and the process illustrated in each of these figures is performed in the state in which the wafer W is carried into the processing container and the interior of the processing container is evacuated to create a vacuum atmosphere of a predetermined pressure. In the figures, reference numeral 16 indicates pores formed in the SiOCN film 15. In addition, in the present embodiment, methanol ($CH_3OH$) is used as the above-described protective film forming gas, and is indicated by reference numeral 21 in the figures. The etching gas is indicated by reference numeral 22. In addition, the protective film formed on the surfaces of the SiOCN film 15 and the silicon oxide film 12 by the methanol 21 is indicated by reference numeral 23. As described above, the protective film 23 is also formed on the polysilicon film 14, but this protective film 23 is thinner than the protective film 23 formed on each of the SiOCN film 15 and the silicon oxide film 12 and the illustration thereof is omitted.

Figure 2A:
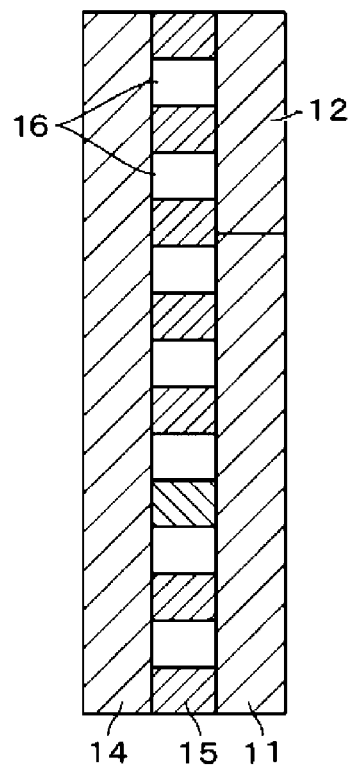
FIG. 2A is a process diagram illustrating the etching.
Figure 2B:
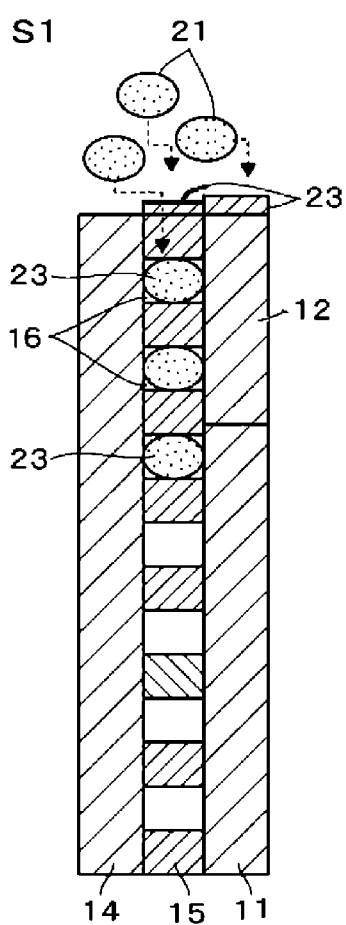
FIG. 2B is a process diagram illustrating the etching.

First, the vaporized methanol 21 is supplied into the processing container (step S1, FIGS. 2A and 2B). As described above, since the methanol 21 is easily adsorbed on the SiOCN film 15 and the silicon oxide film 12, adsorption on the surface (the top surface) of each of these films proceeds, and the protective film 23 is formed. In addition, the methanol 21 is adsorbed on the pore walls in the SiOCN film 15 and stays in the pores 16 to close the pores 16. Therefore, as described above, the protective film 23 is also formed in the pores 16.

Figure 2C:
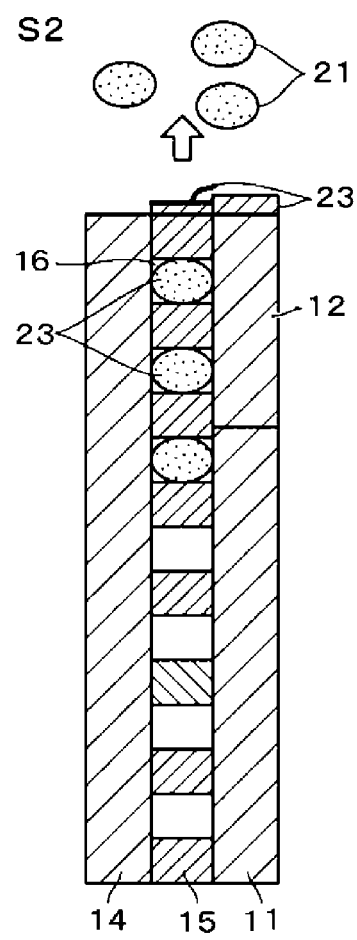
FIG. 2C is a process diagram illustrating the etching.
Figure 3A:
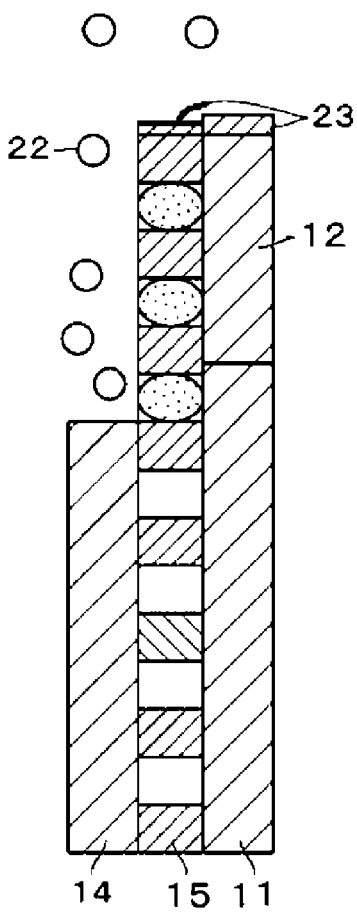
FIG. 3A is a process diagram illustrating the etching.
Figure 3B:
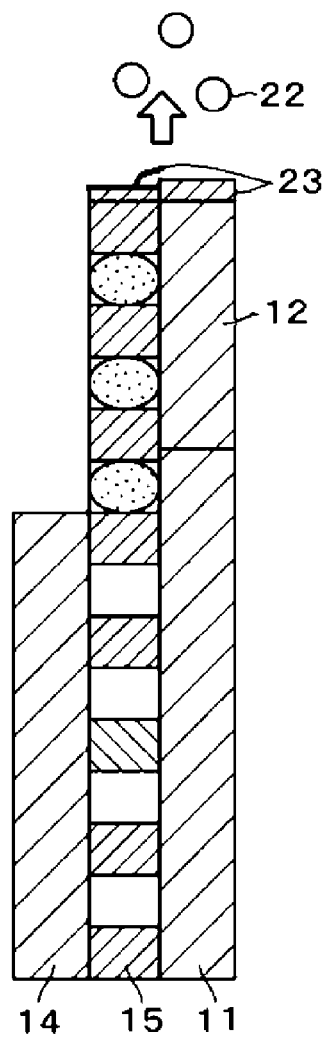
FIG. 3B is a process diagram illustrating the etching.

Subsequently, the supply of the vaporized methanol 21 into the processing container is stopped, and the exhaust and the supply of a purge gas (e.g., nitrogen ($N_2$) gas) are performed in the processing container (step S2, FIG. 2C). As a result, the methanol 21, which is not adsorbed on each film and does not form the protective film 23, is removed by the flow of the exhausted purge gas.

Subsequently, the etching gas 22 is supplied into the processing container. The protective film 23 formed on each film is etched, but as described above, the protective film 23 on the polysilicon film 14 is thin and thus disappears during etching. Therefore, the protective film 23 is formed only on the SiOCN film 15 and the silicon oxide film 12, and the polysilicon film 14 is selectively etched to expose the side wall on the upper portion of the SiOCN film 15 (step S3, FIG. 3A). Since the pores 16 on the upper portion of the SiOCN film 15 are closed by the methanol 21, the etching gas 22 is prevented from passing through the pores 16 and being supplied to the side wall of the SiGe film 11. That is, as described above, etching of the SiGe film 11 from the lateral side through the pores 16 is prevented. Thereafter, the supply of the etching gas 22 into the processing container is stopped, and the exhaust and the supply of a purge gas are performed inside the processing container (step S4, FIG. 3B). Thus, the etching gas 22 remaining in the processing container is removed by the flow of the purge gas exhausted from the interior of the processing container.

Figure 4A:
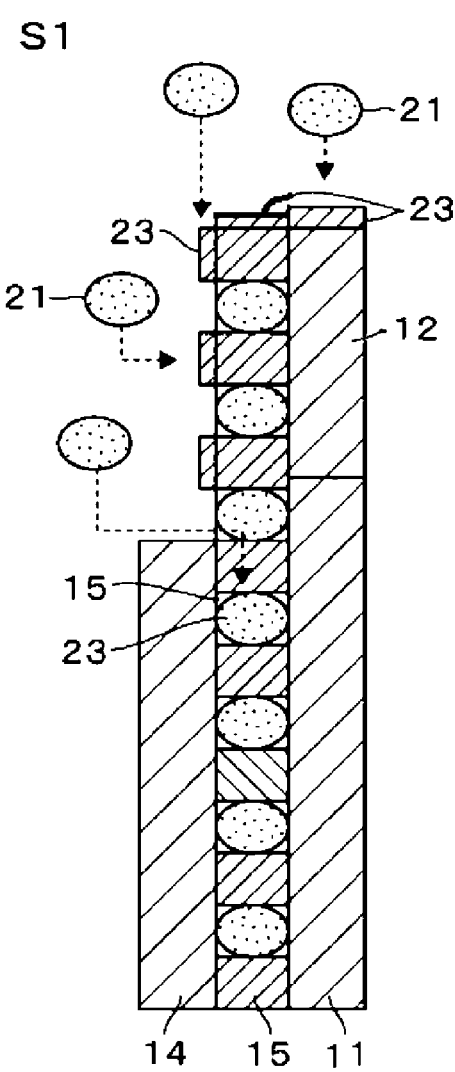
FIG. 4A is a process diagram illustrating the etching.

Subsequently, vaporized methanol 21 is supplied into the processing container. That is, step S1 is executed again. In step S3 above, the polysilicon film 14 is etched to expose the side wall at the upper portion of the SiOCN film 15. Therefore, the methanol 21 in the gas supplied in the second step S1 is supplied to the pores 16 below the pores 16 to which the methanol 21 was supplied in the first step S1 in the SiOCN film 15, and is adsorbed on the pore walls to close the pores 16 (FIG. 4A). In addition, a protective film 23 is also formed on the side wall of the exposed SiOCN film 15.

Thereafter, the exhaust and the supply of the purge gas in the processing container of step S2 are performed again. Subsequently, the supply of the etching gas 22 into the processing container in step S3 is performed. At this time, as in the case of the first etching, the protective film 23 formed on the polysilicon film 14 disappears rapidly, while the protective film 23 remains on the SiOCN film 15 and the silicon oxide film 12. Thus, the polysilicon film 14 is selectively further etched downward. As a result, the exposed region on the side wall of the SiOCN film 15 is increased downward.

Figure 4B:
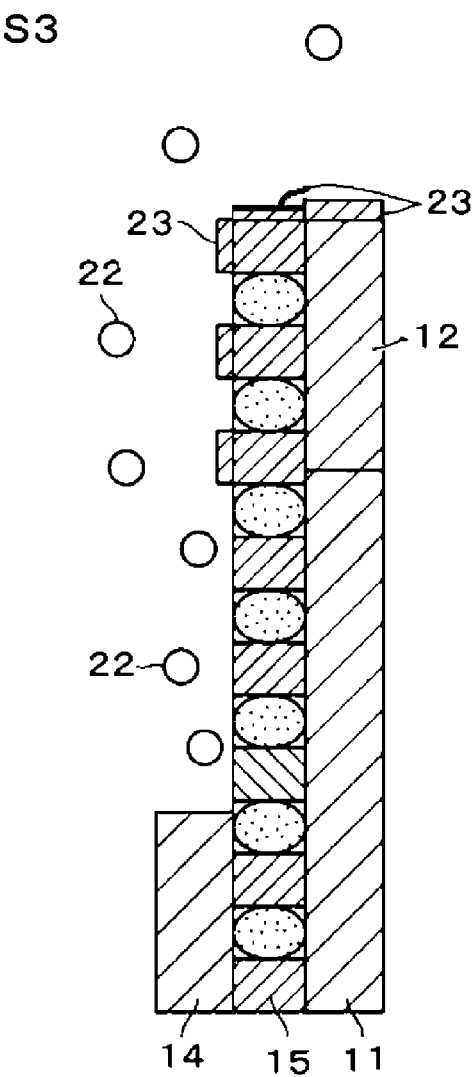
FIG. 4B is a process diagram illustrating the etching.

In addition, by the second step S1, the region to which the methanol 21 is supplied in the SiOCN film 15 is increased downward. Therefore, the methanol 21 remains in the pores 16 near the side wall of the SiOCN film 15 newly exposed by etching the polysilicon film 14. Therefore, in this second step S3 as well, the etching gas is prevented from passing through the pores 16 of the SiOCN film 15 and etching the silicon oxide film 12 (FIG. 4B). After this etching, the exhaust and the purge gas supply in step S4 are performed again.

Figure 5A:
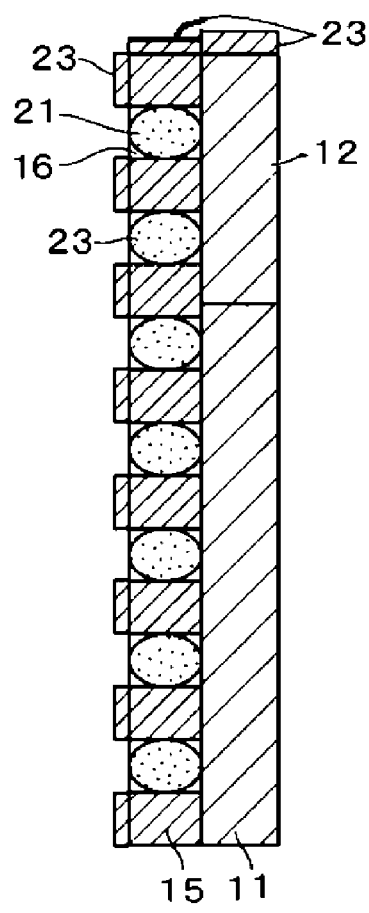
FIG. 5A is a process diagram illustrating the etching.
Figure 5B:
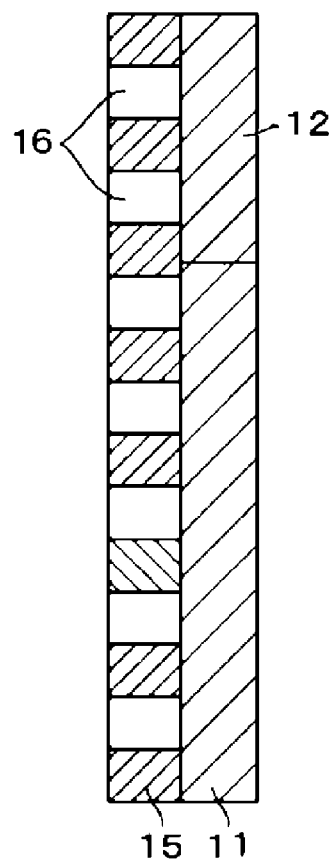
FIG. 5B is a process diagram illustrating the etching.

Assuming that steps S1 to S4 performed in this order are one cycle, for example, even after the second step S4 is performed, the cycle is repeatedly performed, and the polysilicon film 14 is etched downward. Then, for example, when all the polysilicon film 14 is etched and thus a predetermined number of cycles are completed (FIG. 5A), the wafer W is heated (step S5). The heating of the wafer W (step S5) causes the methanol 21 forming the protective film 23 to be vaporized and removed from the wafer W (FIG. 5B).

Figure 6:
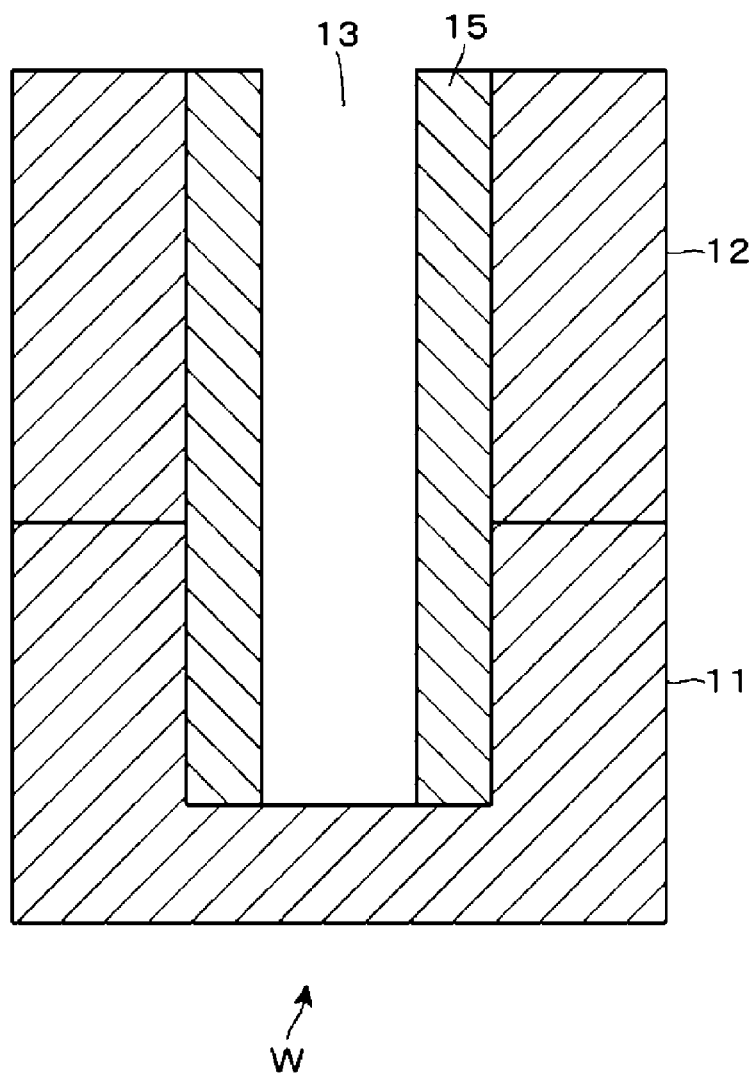
FIG. 6 is a vertical cross-sectional side view of the surface of the wafer after the etching.

Although it has been described that the methanol 21 stays on the surface of the wafer W during etching in the above-described series of processes, it is also conceivable that the methanol 21 reacts with the etching gas 22 to become a reaction product and stays on the surface of the wafer W. The methanol 21 may remain as the reaction product as such. Then, when the reaction product is generated, in step S5, heating is performed to remove the reaction product. That is, the heating in step S5 is heating for removing the methanol 21 and/or the reaction product, and specifically, the wafer W is heated to, for example, 100 degrees C. to 400 degrees C. FIG. 6 illustrates the surface portion of the wafer W after the execution of step S5, and in a recess 13 formed by removing the polysilicon film 14, for example, a gate of a semiconductor device is formed in a later step.

As described above, according to the processes of the above-described embodiment, a protective film 23 having a thickness smaller than those of other films is formed on the polysilicon film by using the difference in the adsorptivity of the methanol 21 among the silicon oxide film 12, the polysilicon film 14, and the SiOCN film 15. As a result, at the time of etching, since the polysilicon film 14 may be in the state of being uncovered with the protective film 23 while the protective film 23 remains on the other films and thus the other films are covered with the protective film 23, it is possible to selectively etch the polysilicon film 14. Then, when etching the polysilicon film 14 in this way, the protective film 23 formed in the pores 16 of the SiOCN film 15 prevents the etching gas 22 from passing through the pores 16 so that the etching of the SiGe film 11 from the lateral side can be prevented. By sealing the pores of the SiOCN film 15 which is a porous film in this way, etching of the silicon oxide film 12 from the lateral side is also prevented.

The exhaust flow rate of the processing container may be constant in steps S1 to S4 described above, and the exhaust flow rate in steps S2 and S4 for removing unnecessary gas in the processing container may be larger than the exhaust flow rate in steps S1 and S3 so that the gas can be removed more reliably. Further, in steps S2 and S4, the unnecessary gas may be removed only by exhaust without supplying the purge gas.

The film structure of the wafer W illustrated in FIG. 1 is an example, and the S1 film to be etched is not limited to the polysilicon film 14, and may be, for example, an amorphous silicon ($\alpha$-Si) film. The porous film is not limited to the SiOCN film 15, and a porous film such as a SiCO film or a SiCOH film may be formed instead of the SiOCN film 15.

An example in which methanol, which is an alcohol, is used as a gas for forming a protective film has been illustrated. As described above, however, it is sufficient that the polysilicon film 14 can be etched while protecting the underlayer film (the SiGe film 11) as described above by using the difference in adsorptivity to each film due to a hydroxyl group. Therefore, alcohols other than methanol, such as ethanol and isopropyl alcohol, may be used as the protective film forming gas, and phenols may also be used as the protective film forming gas. In addition, a gas obtained by mixing a plurality of kinds of substances from among various compounds including a hydroxyl group or water may be used as the protective film forming gas.

In the above-described embodiment, steps S1 to S4 are illustrated to be repeated three or more times, but the number of repetitions is not limited to the above example, and may be, for example, two times. In addition, steps S1 to S4 may be performed only once without repeating. The above-described steps S2 and S4 for removing unnecessary gas may be omitted. Specifically, as illustrated in FIG. 7A illustrating each of the timing of supplying the protective film forming gas into the processing container and the timing of supplying the etching gas into the processing container, from the end of supply of one of the protective film forming gas and the etching gas, the other gas may be supplied without a gap. Even when steps S2 and S4 are omitted in this way, steps S1 and S3 for supplying the protective film forming gas and the etching gas, respectively, are not limited to being repeated, and may be performed only once.

Figure 7B:
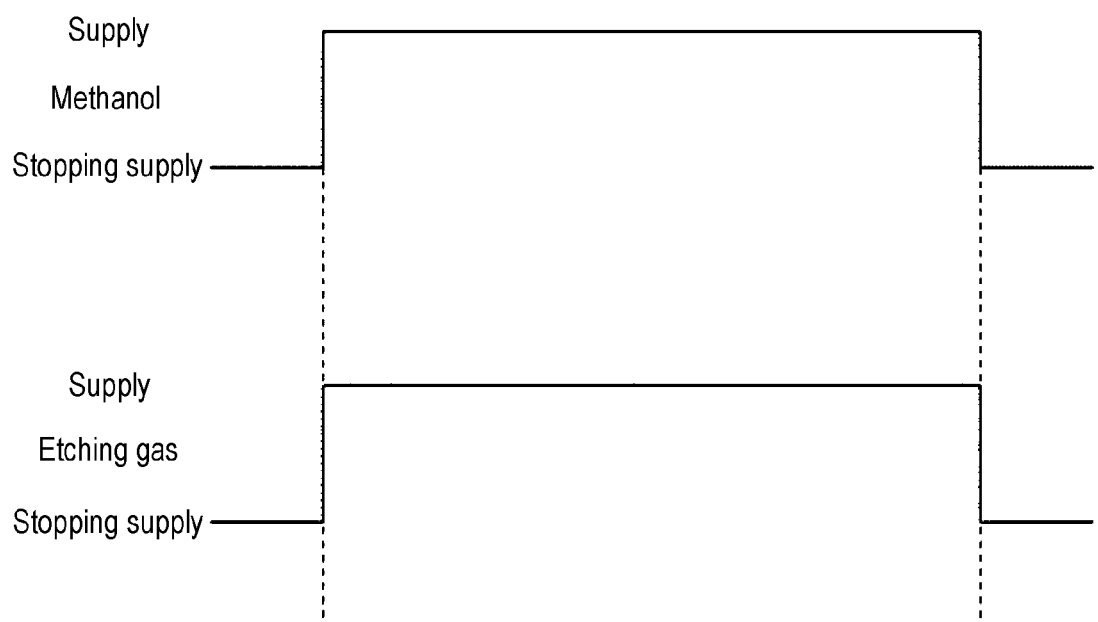
FIG. 7B is a chart illustrating an example of gas supply timing during etching.

Furthermore, the protective film forming gas and the etching gas 22 are not limited to being supplied in order. That is, the protective film forming gas and the etching gas 22 are not limited to starting the supply of one gas after the supply of the other gas is completed, and as illustrated in FIG. 7B, the protective film forming gas and the etching gas 22 may be simultaneously supplied to the wafer W to perform processes. When the protective film forming gas and the etching gas 22 are simultaneously supplied in this way, the formation of the protective film 23 and the etching of the polysilicon film 14 are performed in parallel.

The polysilicon film 14 is etched by forming a protective film as described above, but a residue may adhere to the surface of the wafer W after etching (after step S3). It is considered that this residue is a CF-based compound composed of C (carbon) constituting the protective film forming gas and F (fluorine) constituting the etching gas, that is, a reaction product between the protective film forming gas and the etching gas. In order to remove this residue, a fluorine-containing gas may be supplied as a purge gas in step S4 after etching. The residue is sublimated and removed by reacting the residue with the purge gas to be changed into a CF-based compound different from the compound constituting the residue. By removing the residue in this way, when the processes are performed by repeating steps S1 to S4 as described above, it is possible to suppress the residue from obstructing the supply of the etching gas to the polysilicon film 14, and thus it is possible to prevent a decrease in the etching amount of the polysilicon film 14.

The purging in step S4 is performed by an inert gas such as $N_2$ gas, which will be described later, and steps S1 to S4 are repeated as described above. After this repetition, the residue accumulated on the surface of the wafer W may be collectively sublimated and removed by supplying a fluorine-containing gas as the purge gas before performing the heat treatment in step S5. In this case, the residue is prevented from remaining attached to the wafer W after the processes are completed, and thus a decrease in the yield of semiconductor devices is suppressed.

The fluorine-containing gas for sublimating this residue may be the same gas as or different from the etching gas. As a specific example, chlorine trifluoride ($ClF_3$) gas, iodine pentafluoride ($IF_5$) gas, bromine trifluoride ($BrF_3$) gas, iodine heptafluoride ($IF_7$) gas, or the like may be used. As described above, the residue is considered to be derived from the carbon atoms of the protective film forming gas. Therefore, it is considered that the amount of this residue generated may be relatively reduced or prevented from being generated by using, for example, a compound having a relatively small number of carbon atoms as the protective film forming gas. That is, the step of sublimating the residue with this fluorine-containing gas is not essential. In the evaluation experiment which will be described later, it was shown that methanol, ethanol, isopropyl alcohol, and water, that is, compounds having a very small carbon number of 0 to 3 can be used as the protective film forming gas. These compounds can also be preferably used from the viewpoint of reducing the generated amount of the above-mentioned residue.

In the above-described embodiment, in step S5, the wafer W is heated so that the methanol 21 and/or the reaction product of the methanol 21 and fluorine in the etching gas is removed from the SiOCN film 15. However, even if the methanol 21 and/or the reaction product is adsorbed on the surfaces of the silicon oxide film 12 and the SiOCN film 15 (including the surfaces of the pores 16), if there is no problem in the post-process treatment or the practical use of the product, the methanol 21 and/or the reaction product may remain as such. Therefore, the heating process in step S5 is not always essential.

Subsequently, a substrate processing apparatus 3 for performing the series of processes described above will be described with reference to the plan view of FIG. 8. The substrate processing apparatus 3 includes a carry-in/out part 31 for carrying in/out a wafer W, two load lock chambers 41 provided adjacent to the carry-in/out part 31, two heat treatment modules 40 provided adjacent to the two load lock chambers 41, respectively, and two etching modules 5 provided adjacent to the two heat treatment modules 40, respectively.

The carry-in/out part 31 includes a normal pressure transport chamber 33 provided with a first substrate transport mechanism 32 and having a normal pressure atmosphere, and a carrier stage 35 provided at a side of the normal pressure transport chamber 33 and configured to place thereon carriers 34 for accommodating wafers W. In the figure, reference numeral 36 indicates an orienter chamber adjacent to the normal pressure transport chamber 33, and the orienter chamber 36 is provided to rotate a wafer W to optically obtain the amount of eccentricity and to align the wafer W with respect to the first substrate transport mechanism 32. The first substrate transport mechanism 32 transports wafers W among the carriers 34 on the carrier stage 35, the orienter chamber 36, and the load lock chambers 41.

In each load lock chamber 41, for example, a second substrate transport mechanism 42 including an articulated arm structure is provided, and the second substrate transport mechanism 42 transports wafers W among the load lock chamber 41, a heat treatment module 40, and an etching module 5. The interior of a processing container constituting each heat treatment modules 40 and the interior of the processing container constituting each etching module 5 have a vacuum atmosphere, and inside each load lock chamber 41, a normal pressure atmosphere and a vacuum atmosphere are switched so that wafers W can be transferred between the interiors of the processing containers having vacuum atmospheres and the normal pressure transport chamber 33.

In the figure, reference numeral 43 indicates gate valves, which can be opened and closed and are provided between the normal pressure transport chamber 33 and the load lock chambers 41, between the load lock chambers 41 and the heat treatment modules 40, and between the heat treatment modules 40 and the etching modules 5, respectively. Each heat treatment module 40 includes the above-mentioned processing container, an exhaust mechanism configured to evacuate the interior of the processing container to form a vacuum atmosphere, a stage provided in the processing container and configured to be capable of heating a wafer W placed thereon, and the like, and is configured to be capable of executing step S5 described above.

Subsequently, the etching module 5 will be described with reference to the vertical cross-sectional side view of FIG. 9. The etching module 5 is a module that performs the processes of steps S1 to S4 on a wafer W, and includes, for example, a circular processing container 51. That is, the processes of steps S1 to S4 are performed in the same processing container. The processing container S1 is an airtight vacuum container, and a circular stage 61 having a horizontally formed surface (top surface) on which a wafer W is placed is provided at the lower portion of the interior of the processing container S1. In the figure, reference numeral 62 indicates a stage heater embedded in the stage 61, and the stage heater 62 heats the wafer W to a predetermined temperature such that the above-described steps S1 to S4 can be performed. In the figure, reference numeral 63 indicates a support column that supports the stage 61, which is a placement part, on the bottom surface of the processing container S1. In the figure, reference numeral 64 indicates vertical lifting pins, the lifting pins 64 protrude and retreat from the surface of the stage 61 by a lifting mechanism 65 to transfer a wafer W between the above-mentioned second substrate transport mechanism 42 and the stage 61. Three lifting pins 64 are provided, but only two are illustrated.

In the figure, reference numeral 66 indicates a side wall heater provided in the side wall of the processing container 51, which adjusts the temperature of the atmosphere inside the processing container 51. The side wall of the processing container 51 is provided with a transport port for the wafer W, which can be opened and closed (not shown). In the figure, reference numeral 67 indicates an exhaust port opened in the bottom surface of the processing container 51, and the exhaust port 67 is connected to an exhaust mechanism 68 including a vacuum pump, a valve, and the like via an exhaust pipe. By adjusting the exhaust flow rate from the exhaust port 67 by the exhaust mechanism 68, the pressure in the processing container 51 is adjusted.

Above the stage 61, on the ceiling of the processing container 51, a gas shower head 7 constituting a protective film forming gas supplier and an etching gas supplier is provided to face the stage 61. The gas shower head 7 includes a shower plate 71, a gas diffusion space 72, and a diffusion plate 73. The shower plate 71 is horizontally provided to form a bottom surface portion of the gas shower head 7, and a large number of gas ejection holes 74 are dispersed in the shower plate 71 to eject gas to the stage 61 in a shower form. The gas diffusion space 72 is a flat space formed such that the lower side thereof is partitioned by the shower plate 71 in order to supply gas to each gas ejection hole 74. The diffusion plate 73 is horizontally provided to divide the gas diffusion space 72 into upper and lower portions. Reference numeral 75 in the figure indicates through holes formed in the diffusion plate 73, and a large number of through holes 75 are dispersed and perforated in the diffusion plate 73. In the figure, reference numeral 77 indicates a ceiling heater, which adjusts the temperature of the gas shower head 7.

The downstream ends of the gas supply pipes 78 and 81 are connected to the upper side of the gas diffusion space 72. The upstream side of the gas supply pipe 78 is connected to a supply source 70 of $ClF_3$ gas via a flow rate adjusting part 79. The flow rate adjusting part 79 is configured with a valve and a mass flow controller to adjust the flow rate of the gas supplied to the downstream side of the gas supply pipe 78. Each flow rate adjusting part, which will be described later, has the same configuration as the flow rate adjusting part 79, and adjusts the flow rate of the gas supplied to the downstream side of the pipe through which the flow rate adjusting part is interposed.

The upstream side of the gas supply pipe 81 is connected to a tank 83 in which methanol gas is stored via a flow rate adjusting part 82, and thus configured to supply the methanol gas to the downstream side of the gas supply pipe 81. For example, the gas supply pipe 81 branches at the downstream side of the flow rate adjusting part 82 to form a gas supply pipe 84. The gas supply pipe 84 is connected to a nitrogen ($N_2$) gas source 86 via a flow rate adjusting part 85. Therefore, methanol gas and $N_2$ gas can be independently supplied to the gas shower head 7.

The correspondence between the above-described steps S1 to S4 executed in the etching module 5 and the gases supplied from the gas shower head 7 will be described. In step S1, methanol gas is supplied to the gas shower head 7 from the above-described tank 83 and supplied into the processing container 51. In steps S2 and S4, $N_2$ gas is supplied to the gas shower head 7 from the $N_2$ gas source 86, and then supplied as a purge gas into the processing container 51. In step S3, the supply of gases from the tank 83 and the $N_2$ gas source 86 is stopped, and $ClF_3$ gas is supplied from the supply source 70 to the gas shower head 7 to be supplied into the processing container 51.

Figure 8:
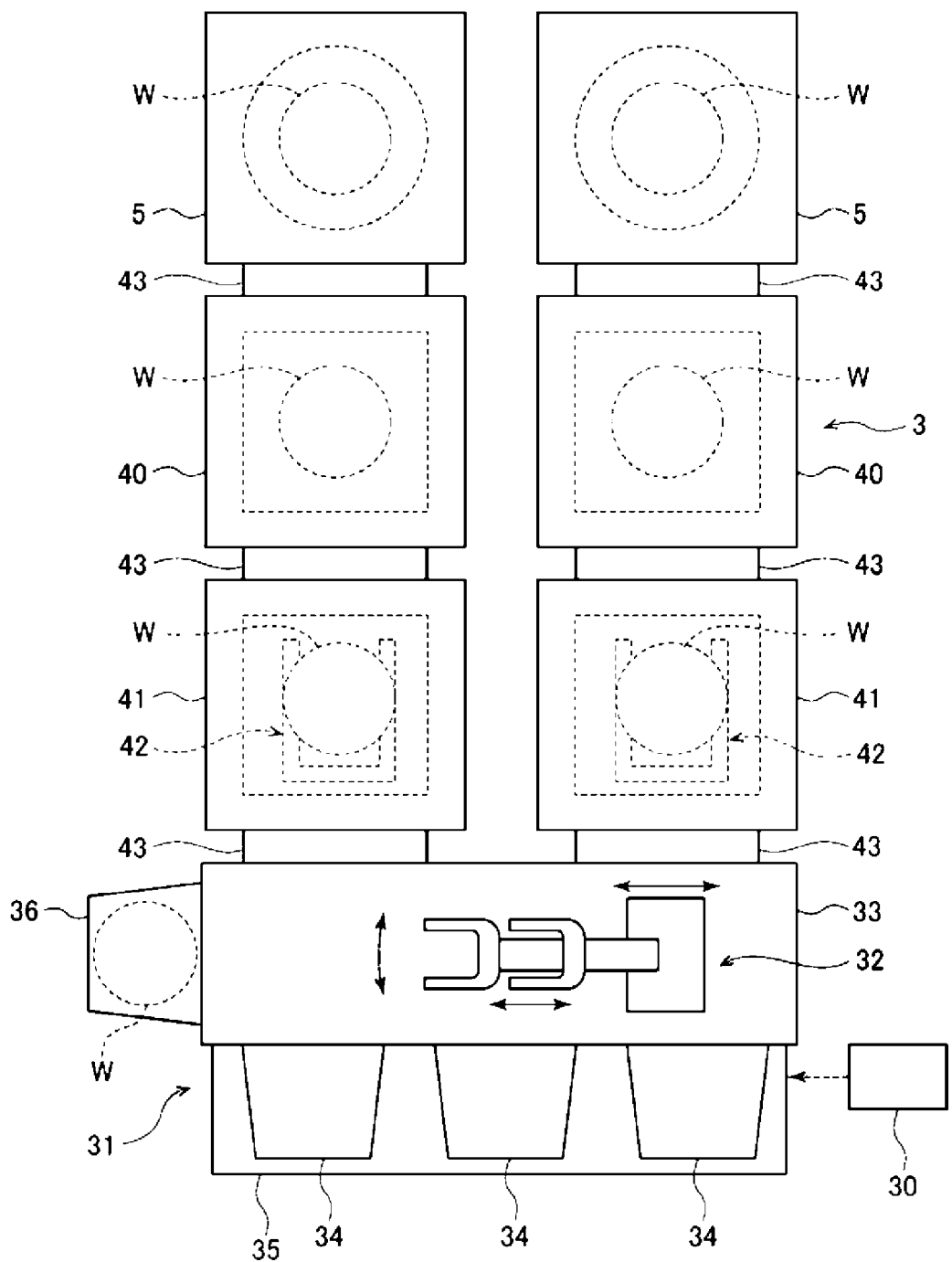
FIG. 8 is a plan view of a substrate processing apparatus for performing etching.
Figure 9:
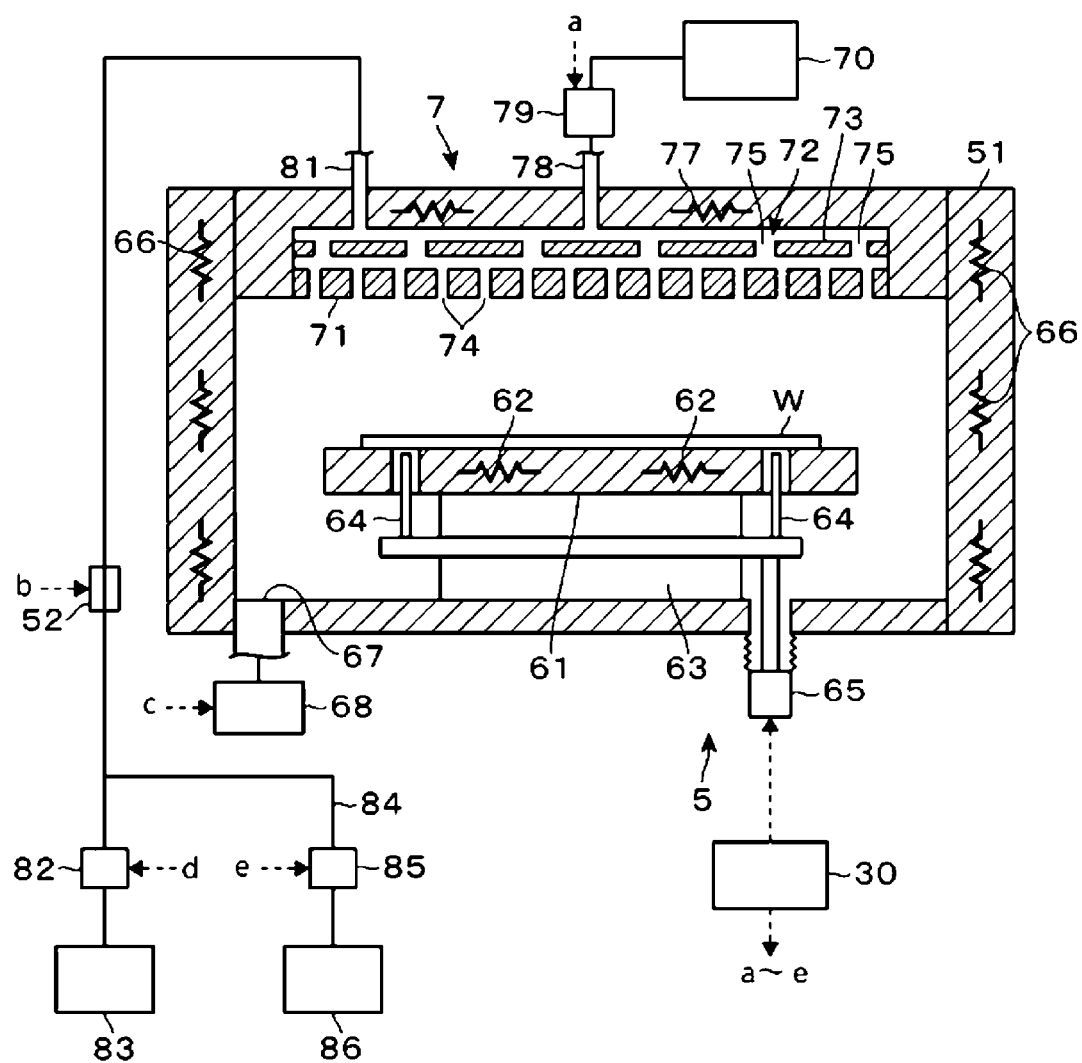
FIG. 9 is a vertical cross-sectional side view of an etching module provided in the substrate processing apparatus.

As illustrated in FIGS. 8 and 9, the substrate processing apparatus 3 includes a controller 30 which is a computer, and the controller 30 includes a program, a memory, and a CPU. The program incorporates instructions (each step) for processing a wafer W and transporting the wafer W as described above, and the program is stored in a non-transient computer readable storage media such as a compact disk, a hard disk, a magneto-optical disk, a DVD, or the like and installed in the controller 30. The controller 30 outputs a control signal to each part of the substrate processing apparatus 3 according to the program to control the operation of each part. Specifically, the operation of the etching module 5, the operation of the heat treatment module 40, the operation of the first substrate transport mechanism 32, the operation of the second substrate transport mechanism 42, and the operation of the orienter chamber 36 are controlled by control signals. The operations of the etching module 5 include respective operations such as adjusting the output of each heater, supplying and interrupting each gas from the gas shower head 7, adjusting the exhaust flow rate by the exhaust mechanism 68, and raising and lowering the lifting pins 64 by the lifting mechanism 65. An etching apparatus is configured by the controller 30 and the etching module 5.

A wafer W transport path in the substrate processing apparatus 3 will be described. As described with reference to FIG. 1, a carrier 34 accommodating a wafer W on which each film is formed is placed on the carrier stage 35. Then, the wafer W is transported in the order of the normal pressure transport chamber 33, the orienter chamber 36, the normal pressure transport chamber 33, and a load lock chamber 41, and then transported to an etching module 5 via a heat treatment module 40. Then, as described above, the cycle consisting of steps S1 to S4 is repeatedly performed to process the wafer W. Subsequently, the wafer W is transported to the heat treatment module 40 and subjected to the process of step S5. Thereafter, the wafer W is transported in the order of the load lock chamber 41 and the normal pressure transport chamber 33, and then returned to the carrier 34.

In the etching module 5, the residue after etching may be removed by supplying the above-described fluorine-containing gas (purge gas). When $ClF_3$ gas, which is an etching gas, is used as the purge gas for removing the residue, the piping system of the etching module 5 may be configured as described above. When a gas different from the $ClF_3$ gas is used as the purge gas for removing the residue, the pipe for the purge gas, which includes a flow rate adjusting part, may be added to the above-mentioned piping system such that the purge gas can be supplied to the gas shower head independently of the $ClF_3$ gas, the methanol gas, and the $N_2$ gas.

The substrate processing apparatus may have a configuration in which the supply of the methanol gas and the supply of the etching gas may be performed in different processing containers, and the wafer W may be transported between these processing containers by a transport mechanism. However, by supplying these gases in the same processing container, it is possible to save the time for transporting the wafer W between the modules in repeating the above-mentioned cycle. Therefore, with the configuration of the substrate processing apparatus 3, the throughput can be improved.

FIGS. 1 to 6 illustrate an example in which protective films are formed on the silicon oxide film 12 as the first film and the polysilicon film 14 as the second film with a first film thickness and a second film thickness smaller than the first film thickness, respectively, using the difference in the adsorptivity of the protective film forming gas, so that the polysilicon film 14 is selectively etched. As shown in the evaluation experiment which will be described later, the protective film forming gas exhibits different adsorptivity to various films, but when the protective film forming gas has higher adsorptivity to the first film from among the first film (a protected film) and the second film (an etched film), the second film can be selectively etched. That is, in performing selective etching of the second film from among the first film and the second film, the first film and the second film formed on the surface of the wafer W are not limited to the silicon oxide film 12 and the polysilicon film 14, respectively, as long as the first film and the second film have different adsorptivity to the protective film forming gas.

Among silicon-containing compounds, a compound containing N or O as described above is likely to form a hydrogen bond with a compound including a hydroxyl group or water. Therefore, as the first film, for example, SiN may be used in addition to SiOCN and silicon oxide already exemplified. As the second film, for example, a silicon-containing compound not including N or O (e.g., silicon carbide (SiC)) may be used. Here, including N or O means that N or O is included as a constituent element of the film, and does not mean that N or O is included as an impurity.

Figure 10B:
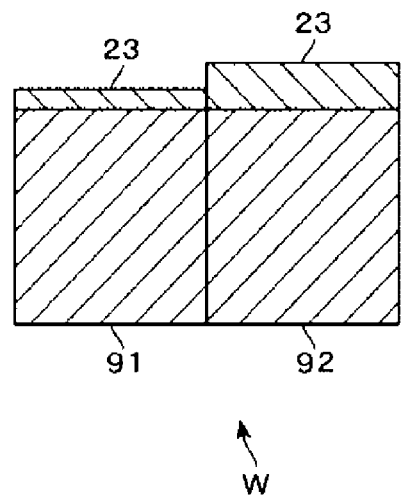
FIG. 10B is a process diagram illustrating the etching.
Figure 10C:
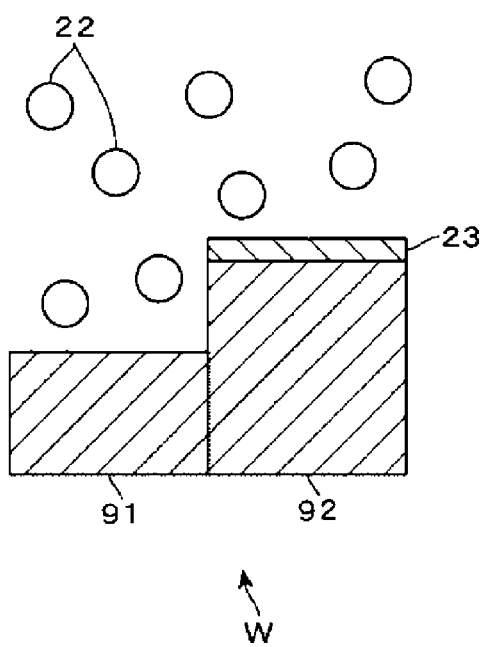
FIG. 10C is a process diagram illustrating the etching.

Specifically, as illustrated in FIG. 10A, for example, it is assumed that the SiC film 91 (the second film) and the SiN film 92 (the first film) are formed side by side on the surface of the wafer W. The protective film forming gas is supplied, and the protective film 23 is formed thicker on the SiN film 92 than on the SiC film 91 (FIG. 10B). By supplying the etching gas 22, the SiC film 91 is etched while protecting the SiN film 92 (FIG. 10C).

It was described that a protective film is formed on the second film (an etched film) with the second film thickness using a protective film forming gas, but the second film thickness includes zero. That is, the protective film forming gas does not have adsorptivity to the second film, and the protective film may not be formed on the second film. The first film and the second film are not limited to the silicon-containing compound, and may be, for example, a metal film.

As described above, the film to be etched is not limited to the polysilicon film illustrated in FIGS. 1 to 6. Therefore, the etching gas is also appropriately selected depending on the film to be etched. In etching the silicon-containing compound, such as Si or SiC described above, a gas composed of a fluorine compound, such as $F_2$ gas, $IF_5$ gas, $BrF_3$ gas, or $IF_7$ gas, may be used in addition to $ClF_3$ gas.

In the above-described embodiments, the first film to be protected and the second film to be etched are illustrated to be arranged side by side, but each of these films may be exposed on the surface of the substrate. For example, each of these films may be arranged in the longitudinal direction. That is, there is no limitation on the positional relationship between these films. It shall be understood that the embodiments disclosed herein are examples in all respects and are not restrictive. The above-described embodiments may be omitted, replaced, modified and/or combined in various forms without departing from the scope and spirit of the appended claims.

(Evaluation Experiment)

An evaluation experiment conducted in connection with the technique of the present disclosure will be described.

As an evaluation experiment, adsorption energies for various molecules including Si were measured through simulation for methanol, ethanol, isopropyl alcohol, which are compounds each including a hydroxyl group, and water. Specifically, the adsorption energies for silicon (Si), silicon carbide (SiC), silicon nitride (SiN), $SiO_2CN$ (=SiOCN), and silicon oxide (SiO) were measured.

Figure 11:
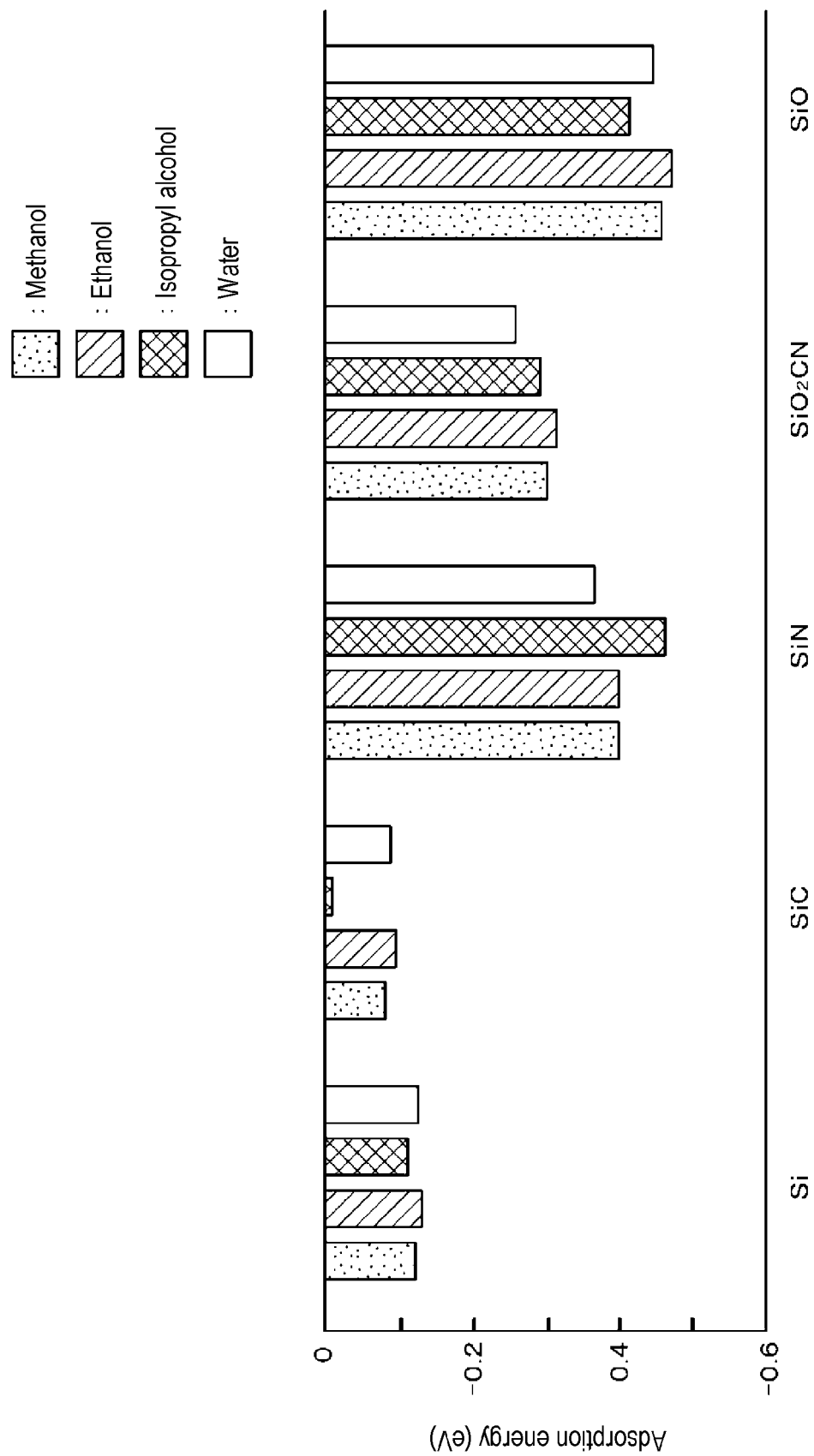
FIG. 11 is a graph representing results of an evaluation experiment.

FIG. 11 is a bar graph showing the results of the evaluation experiment. The vertical axis of the graph represents an adsorption energy (unit: eV), and the lower the adsorption energy, the more likely the component is adsorbed. As illustrated in FIG. 11, the adsorption energies of a compound including a hydroxyl group and water are different among Si, SiC, SiN, $SiO_2CN$, and SiO. Among these, for SiN, $SiO_2CN$, and SiO, the adsorption energies of the compound including a hydroxyl group and water are significantly negative compared with Si and SiC. As described above, the compound including a hydroxyl group and water have a large adsorptivity to SiN, $SiO_2CN$, and SiO compared with Si and SiC.

From the results of this evaluation experiment, it can be seen that the adsorptivity of various compounds having a hydroxyl group and water differs depending on the type of silicon-containing film. Therefore, it is presumed that it is possible to protect one of the silicon-containing films while etching the other one of the silicon-containing films by using the difference in the adsorptivity of the compounds including a hydroxyl group and water, as described in the embodiments. In addition, the graph of FIG. 11 shows that the difference in adsorption energy between Si and SiO is particularly large. It is shown that the difference in adsorption energy between Si and SiOCN is also large. Therefore, it can be seen that the selective etching of a Si film using the protective film 23 described in the embodiments can be performed. Furthermore, it can be seen that, since the adsorption energy of the compound including a hydroxyl group and water with respect to SiOCN is low, the sealing of the pores 16 of the SiOCN film 15 described in the embodiments can be sufficiently performed.

According to the present disclosure, a desired film can be selectively etched from among a plurality of types of films formed on the surface of a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An etching method comprising:
   forming a protective film by supplying a protective film forming gas including at least one of a compound including a hydroxyl group and water to a substrate including a surface on which a first film and a second film are formed, each of which has a property of being etched by an etching gas, wherein the protective film covers the first film such that the first film is selectively protected from among the first film and the second film when the etching gas is supplied; and
   selectively etching the second film by supplying the etching gas to the substrate in a state in which the protective film is formed,
   wherein the first film, a porous film, and the second film are provided adjacent to each other in this order on the substrate,
   the forming the protective film includes forming the protective film in a pore of the porous film to close the pore, and
   the selectively etching the second film includes supplying the etching gas in a state in which the pore of the porous film is closed.

2. The etching method of claim 1, wherein the first film and the second film are different types of silicon-containing films.

3. The etching method of claim 2, wherein the first film includes nitrogen or oxygen.

4. The etching method of claim 3, wherein the first film is any of a SiOCN film, a silicon oxide film, and a silicon nitride film, and the second film is a Si film or a SiC film.

5. The etching method of claim 1, wherein the compound including the hydroxyl group is an alcohol.

6. The etching method of claim 5, further comprising:
   heating the substrate to remove the protective film or a reaction product produced by a reaction of the etching gas with the protective film after performing the forming the protective film and the selectively etching the second film.

7. The etching method of claim 6, further comprising:
repeating the forming the protective film and the selectively etching the second film multiple times in this order.

8. The etching method of claim 7, further comprising:
supplying a fluorine-containing gas to remove a residue produced by the selectively etching the second film.

9. The etching method of claim 1, further comprising:
heating the substrate to remove the protective film or a reaction product produced by a reaction of the etching gas with the protective film after performing the forming the protective film and the selectively etching the second film.

10. The etching method of claim 1, further comprising:
repeating the forming the protective film and the selectively etching the second film plural times in this order.

11. The etching method of claim 1, further comprising:
simultaneously supplying the protective film forming gas and the etching gas to the substrate,
wherein the selectively etching the second film is performed simultaneously with the forming the protective film.

12. The etching method of claim 1, further comprising:
supplying a fluorine-containing gas to remove a residue produced by the selectively etching the second film.

* * * * *